United States Patent [19]

Early

[11] Patent Number: 4,629,912
[45] Date of Patent: Dec. 16, 1986

[54] SCHOTTKY SHUNT INTEGRATED INJECTION

[75] Inventor: James M. Early, Palo Alto, Calif.

[73] Assignee: Fairchild Camera and Instrument Corp., Sunnyvale, Calif.

[21] Appl. No.: 776,992

[22] Filed: Sep. 16, 1985

Related U.S. Application Data

[63] Continuation of Ser. No. 665,266, Oct. 26, 1984, abandoned, which is a continuation-in-part of Ser. No. 545,703, Oct. 25, 1983, abandoned, which is a continuation-in-part of Ser. No. 345,257, Feb. 2, 1982, abandoned.

[51] Int. Cl.$^4$ ............... H03K 19/091; H03K 19/013; H03K 19/003; H01L 29/04
[52] U.S. Cl. .................... 307/459; 307/446; 307/450; 307/551; 307/555; 307/300; 357/92
[58] Field of Search ............... 307/446, 459, 477, 448, 307/450, 551, 555, 280, 300, 299 B; 357/92

[56] References Cited

U.S. PATENT DOCUMENTS

| | | | |
|---|---|---|---|
| 3,916,218 | 10/1975 | Berger et al. | 307/459 |
| 3,993,513 | 11/1976 | O'Brien | 357/44 X |
| 4,009,397 | 2/1977 | Mulder et al. | 307/459 |
| 4,053,923 | 10/1977 | Kang | 307/477 X |
| 4,084,174 | 4/1978 | Crippen et al. | 357/44 |
| 4,165,470 | 8/1979 | Fulkerson | 307/454 |
| 4,286,177 | 8/1981 | Hart et al. | 307/477 X |
| 4,357,548 | 11/1982 | Preslar | 307/459 X |

FOREIGN PATENT DOCUMENTS

| | | | |
|---|---|---|---|
| 99832 | 7/1980 | Japan | 307/459 |
| 24965 | 3/1981 | Japan | 307/477 |

OTHER PUBLICATIONS

Dao, "Threshold I$^2$L and Its Applications to Binary Symmetric Functions and Multivalued Logic", IEEE-JSSC; vol. SC-12, No. 5, pp. 463–472, 10/77.
Feth et al, "High Performance Implementation of MTL"; IBM-TDB; vol. 23, No. 9, pp. 4342–4343; 2/1981.
Berger et al, "Merged-Transistor Logic (MTL)-A-Low-Cost Bipolar Logic Concept"; IEEE-JSSC; vol. SC-7, No. 5, pp. 340–346; 10/1972.
Hart et al, "Integrated Injection Logic: A New LSI Approach"; IEEE-JSSC; vol. SC-7, No. 5, pp. 346–351; 10/1972.
Berger et al, Electronics; pp. 90–103; 10/2/1975.
Poorter, "Electrical Parameters, Static and Dynamic Response of I$^2$L"; IEEE-JSSC, vol. SC-12, No. 5; pp. 440–449; 10/1977.
Lohstroh, "ISL, A Fast and Dense Low-Power Logic, Made in a Standard Schottky Process"; IEEE-JSSC, vol. SC-14, No. 3, pp. 585–590, 6/1979.

Primary Examiner—Larry N. Anagnos
Attorney, Agent, or Firm—Ciotti & Murashige

[57] ABSTRACT

An improved integrated injection logic structure utilizes a current mirror in conjunction with each switching transistor ($M_1$, $M_2$) of the integrated injection logic circuit of this invention by connecting one of a plurality of collectors ($O_0$, $P_0$) of the switching transistor to the base of said switching transistor. In this manner, the current flowing through conducting switching transistors is limited by the current mirror. This limited current flow through conducting switching transistors, as well as the use of voltage pull up means ($D_1$, $D_2$) connected to the collectors of the switching transistors prevents the saturation of conducting switching transistors. This results in an increase in the voltage on the collectors of conducting switching transistors and a decrease in the voltage swing between a logical one and a logical zero, thereby substantially increasing the speed of the integrated injection logic circuit of this invention as compared to prior art integrated injection logic circuits. The voltage pull up means connected to the collectors of the switching transistors may comprise resistors or preferably forward biased Schottky diodes connected between a voltage source ($V_{dd}$) and the collectors of the switching transistors. This invention is also suitable for use in MOS circuits.

35 Claims, 9 Drawing Figures

SCHOTTKY SHUNT INTEGRATED INJECTION

RELATED APPLICATIONS

This application is a continuation of application Ser. No. 665,266, filed Oct. 26, 1984 (now abandoned), which was a continuation-in-part of U.S. Ser. No. 545,703, filed Oct. 25, 1983 (now abandoned), which was a continuation-in-part of U.S. Ser. No. 345,257, filed Feb. 2, 1982 (now abandoned).

BACKGROUND OF THE INVENTION

1. Field of the Invention

This invention relates to integrated circuit structures and specifically to an integrated injection logic circuit utilizing Schottky diodes to limit the signal swing for logic voltages, thus preventing saturation of the transistors forming the integrated injection logic circuit and thereby resulting in an integrated injection logic circuit having increased switching speeds over prior art circuits.

2. Description of the Prior Art

Circuits and structures utilizing integrated injection logic ($I^2L$) are well known in the prior art. $I^2L$ structures are particularly suited for the formation of logic gates of a type wherein each gate comprises a pair of merged complementary transistors. In such a gate, a PNP injector transistor is typically used as a current source for supplying current to the base of an NPN switching transistor. The NPN transistor often has multiple collectors which may be used to drive a plurality of other logic elements. Integrated injection logic circuits are compact, operate at very low voltages, and can be fabricated easily and inexpensively utilizing relatively few masking steps.

Integrated injection logic circuits and structures have been described in various patents and technical articles. See, for example, an article by H. H. Berger and S. K. Wiedman entitled "Merged Transistor Logic (MTL)—a Low-Cost Bipolar Logic Concept" and an article by K. Hart and A. Slob entitled "Integrated Injection Logic: A New Approach to LSI", both in the Journal of Solid-State Circuits, Volume SC-7, No. 5, October 1972 at pages 340-346 and pages 346-351, respectively; U.S. Pat. No. 4,286,177 issued Aug. 25, 1981 to Hart and Slob; see also the article by H. H. Berger and S. K. Wiedmann, "The Bipolar Oxide Breakthrough", Parts 1 and 2, Electronics, Sept. 4, 1975, pages 89-95 and Oct. 2, 1975, pages 99-103, respectively; and the article by T. Porter entitled "Electrical Parameters, Static and Dynamic Response of $I^2L$", IEEE Journal of Solid-State Circuits, Vol. SC-12, No. 5, October 1977, pages 440-449; and U.S. Pat. No. 3,993,513 entitled "Combined Method for Fabricating Oxide-Isolated Bipolar Transistors and Complementary Oxide-Isolated Lateral Bipolar Transistors and the Resulting Structures", assigned to Fairchild Camera and Instrument Corporation, the assignee of this application. A multiple collector structure for bipolar transistors is described in U.S. Pat. No. 4,084,174 entitled "Graduated Multiple Collector Structure for Inverted Vertical Bipolar Transistors" of Crippen, Hingarh, and Verhofstadt, and also assigned to Fairchild Camera and Instrument Corporation. Each of these articles and patents is hereby incorporated by reference.

FIG. 1 shows a schematic diagram of a portion of a typical prior art integrated injection logic circuit. PNP injector transistor $T_1$ serves as a current source, providing current to the base of NPN switching transistor $M_1$. The emitter of transistor $T_1$ is connected to a positive voltage source $V_{EE}$, the base of injector transistor $T_1$ is connected to ground ($V_{GG}$), and the collector of transistor $T_1$ is connected to input terminal 11, which is used for receiving an input signal $V_{in}$. The collector of transistor $T_1$ is also connected to the base of switching transistor $M_1$. The emitter of transistor $M_1$ is connected to ground ($V_{GG}$), and transistor $M_1$ contains a plurality of collectors $O_0$ through $O_3$. Each collector $O_0$ through $O_3$ of transistor $M_1$ may be connected to an input lead of another integrated injection logic gate, or may be left floating. For purposes of this specification, collectors $O_0$ through $O_2$ are shown floating, and only collector $O_3$ of transistor $M_1$ is shown connected to a subsequent integrated injection logic gate.

PNP injector transistor $T_2$ and NPN switching transistor $M_2$ comprise the second integrated injection logic gate of the circuit of FIG. 1. The emitter of PNP transistor $T_2$ is connected to a voltage source $V_{EE}$ and the base of transistor $T_2$ is connected to ground $V_{GG}$. The collector of transistor $T_2$ is connected to collector $O_3$ of transistor $M_1$, thus receiving as an input signal the output signal provided by collector $O_3$ of transistor $M_1$. The collector of transistor $T_2$ is also connected to the base of switching transistor $M_2$. The emitter of NPN switching transistor $M_2$ is connected to ground. The collectors $P_0$ through $P_3$ of transistor $M_2$ provide a plurality of open collector outputs for connection to further logic gates or other circuitry if desired.

The operation of the prior art integrated injection logic circuit of FIG. 1 is as follows. A positive voltage $V_{EE}$ is applied to the emitter of transistor $T_1$. The base of transistor $T_1$ and the emitter of transistor $M_1$ are connected to ground. The emitter-base junction of transistor $T_1$ is forward biased, thus turning transistor $T_1$ on. Thus, transistor $T_1$ supplies current from its emitter connected to $V_{EE}$ to its collector connected to the base of switching transistor $M_1$.

In actual operation, terminal 11 will not be floating but rather will receive a signal $V_{in}$ which will be either a logical one (effectively an open circuit, resulting in a high voltage on node $N_1$, typically 0.7 volts,) or logical zero (effectively a short circuit, thus sinking the current made available at node $N_1$ by the collector of injector transistor $T_1$, resulting in a low voltage on node $N_1$, typically 0.1 volts). With a logical one applied to terminal 11, current is not drawn from the collector of $T_1$ to terminal 11. Thus the injector current made available by the collector of injector transistor $T_1$ is applied to the base and to the base-emitter junction of NPN transistor $M_1$, thereby turning on transistor $M_1$. Thus, transistor $M_1$ conducts when a logical one is applied to input terminal 11.

On the other hand, with a logical zero applied to input terminal 11, current will be drawn from the collector of injector transistor $T_1$ to terminal 11, thus depriving transistor $M_1$ of substantially all of the current supplied by injector transistor $T_1$. With the injector current from the collector of transistor $T_1$ sunk by the logical zero applied to input terminal 11, no current is available to forward bias the base-emitter junction of NPN transistor $M_1$, thereby causing transistor $M_1$ to remain off. Thus, transistor $M_1$ does not conduct when a logical zero is applied to input terminal 11.

PNP injector transistor $T_2$ operates in a manner similar to injector transistor $T_1$. A positive voltage $V_{EE}$ is applied to the emitter of transistor $T_2$, and its base is connected to ground ($V_{GG}$). The emitter-base junction of transistor $T_2$ is forward biased, thus turning transistor $T_2$ on. With transistor $M_1$ conducting (logical one on input terminal 11), the current available from the collector of injector transistor $T_2$ is sunk through collector $O_3$ of transistor $M_1$ to ground (logical zero on node $N_2$), thus depriving transistor $M_2$ of base current, thereby maintaining transistor $M_2$ off. On the other hand, with transistor $M_1$ off (logical zero on input terminal 11), injector current supplied by transistor $T_2$ is not sunk by collector $O_3$ of transistor $M_1$, but rather provides the base current to transistor $M_2$. This base current flows from the base to the emitter of transistor $M_2$, thus turning transistor $M_2$ on.

In this manner, the circuit of FIG. 1 allows a single input signal $V_{in}$ to generate a plurality of output signals to be applied to various gates and circuits as desired. For example, input signal $V_{in}$ provides four inverted signals on open collectors $O_0$ through $O_3$ which are applied to other circuits as desired. Furthermore, the inverted input signal available on collector $O_3$ of transistor $M_1$ is used to generate four non-inverted open collector signals on collectors $P_0$ through $P_3$ of transistor $M_2$. The fact that switching transistors $M_1$ and $M_2$ each are shown with a plurality of four collectors serves as an example only, and it is not be interpreted that the switching transistors utilized in accordance with this invention must contain four collectors. In fact, a greater or lesser number of collectors may be utilized in accordance with well known semiconductor principles. However, as the number of collectors is increased, the capacitance of the device increases, thereby decreasing the switching speed of the circuit.

Furthermore, it is well known that a plurality of input signals may be connected to nodes $N_1$ and $N_2$ of FIG. 1, thus providing for wired NAND logical operations on a plurality of input signals. For example, if a plurality of input terminals (not shown) are connected to node $N_1$ as is input terminal 11 of FIG. 1, the signal on each input terminal connected to node $N_1$ must be a logical one to turn transistor $M_1$ on, thus grounding (logical zero) output leads $O_0$ through $O_3$ of transistor $M_1$. Conversely, a single logical zero on any input terminal connected to node $N_1$ will sink the injector current provided by transistor $T_1$, thus causing transistor $M_1$ to turn off and provide a logical one on output leads $O_0$ through $O_3$ of transistor $M_1$. Thus the additional input leads connected to node $N_1$ perform a wired NAND logic function.

One limitation of the prior art integrated injection logic circuits, such as the one shown in FIG. 1, is that upon the creation of a high voltage (typically 0.7 volts) on input terminal 11 (i.e. when a logical one is applied to input terminal 11), transistor $M_1$ turns on, thus decreasing the voltage on node $N_2$ to $V_{S1}$, where $V_{S1}$ is the collector-emitter voltage of transistor $M_1$ when $M_1$ is saturated. Similarly, with a low voltage (typically around 0.1 volts) applied to input terminal 11, transistor $M_1$ turns off, and the voltage on node $N_2$ is approximately $V_{EE}$-$V_{S2}$, where $V_{S2}$ is equal to the emitter-collector voltage of transistor $T_2$ when transistor $T_2$ is conducting. For typical I²L circuits, $V_{EE}$=0.8 volts, $V_{S1}$=0.1 volts, and $V_{S2}$=0.1 volts. Thus, the voltage on node $N_2$ ranges from $V_{high}$ of approximately 0.7 volts (logical zero on input terminal 11, transistor $M_1$ non-conducting) to $V_{low}$ of approximately 0.1 volts (logical one on input terminal 11, transistor $M_1$ conducting). Thus, node $N_2$ experiences a rather large voltage swing (0.6 volts) between its logical zero and logical one states. This results in the prior art integrated injection logic circuit of FIG. 1 being slow due to the time required to increase the charge on the capacitances of nodes $N_1$ and $N_2$ so as to change the voltages on these nodes from 0.1 volts to 0.7 volts when nodes $N_1$ and $N_2$ change from logical zero to logical one and the time required to decrease the charge on the capacitances of nodes $N_1$ and $N_2$ so as to change the voltages on these nodes from 0.7 volts to 0.1 volts when nodes $N_1$ and $N_2$ change from logical one to logical zero. Furthermore, the prior art I²L circuits such as the circuit of FIG. 1 cause the switching transistors ($M_1$ and $M_2$ of FIG. 1) to saturate when turned on, thus requiring a relatively large period of time to turn off and on as compared to transistors which are not operated in saturation.

The I²L circuit of FIG. 1 has been modified to provide prior art I²L circuits with increased speed. For example, an article entitled "ISL, A Fast and Dense Low-Power Logic, Made in a Standard Schottky Process" written by Lohstroh, IEEE Journal of Solid-State Circuits, Vol. SC-14, No. 3, June 1979, pages 585-590 describes integrated injection logic circuits utilizing Schottky diodes, and is hereby incorporated by reference. In Lohstroh's FIG. 1, a plurality of Schottky diodes are connected each in series with the same collector in order to drive a plurality of outputs. These Schottky diodes serve to reduce the voltage swing between high and low output signals as compared with the prior art I²L circuit of FIG. 1. This arrangement and the output voltage swing between high and low states is temperature dependent and influenced by DC voltage offsets between sequential stages of logic. The circuit of Lohstroh's FIG. 2 adds an additional Schottky diode to prevent saturation of the switching transistor. However, Lohstroh admits that this arrangement is not producible in a standard process, because two types of Schottky diodes are needed with different Schottky barrier heights. Furthermore, the circuit of Lohstroh's FIG. 2 is temperature dependent and adversely influenced by DC voltage offsets between consecutive logic stages. The circuit of Lohstroh's FIG. 3 provides a different technique to prevent saturation of the switching transistor. However, this circuit is also temperature dependent and adversely affected by the DC voltage offsets between consecutive logic stages.

An article by Peltier entitled "A New Approach to Bipolar LSI: C³L", 1975 IEEE International Solid-State Circuits Conference, Friday, Feb. 14, 1975, pages 168-169 describes yet another prior art integrated injection logic circuit, and is hereby incorporated by reference. Peltier's structure utilizes a plurality of Schottky diodes connected each in series with the same collector to provide a plurality of outputs. Peltier utilizes a Schottky transistor as the switching transistor in order to provide a saturation voltage which is not as low as the saturation voltage of NPN switching transistors, as well as to minimize charge storage within the switching transistor. The Peltier circuit is also temperature dependent, and adversely affected by DC offset voltages between consecutive logic stages.

SUMMARY

This invention overcomes several disadvantages of prior art integrated injection logic circuits by providing an integrated injection logic circuit in which the switching transistors are prevented from saturating during conduction and in which the voltage swing between high and low states is limited to approximately 0.1 volts.

A current mirror, wherein maximum current flow through a collector is controlled by the current flow through an associated reference collector, is utilized in conjunction with each switching transistor of the integrated injection logic circuit of this invention by connecting one of a plurality of the collectors of each switching transistor to its base. In this manner, the current flowing through any conducting switching transistor is limited by the current mirror. Limiting current flow through conducting switching transistors, as well as the use of voltage pull up means connected to the bases of the switching transistors, prevents the saturation of the conducting switching transistors. This results in an increase in the voltage on the collectors of conducting switching transistors corresponding to a logical zero, and thus a decrease in the voltage swing between a logical one and a logical zero, thereby substantially increasing the speed of the integrated injection logic circuit of this invention as compared to prior art integrated injection logic circuits. The voltage pull up means connected to the bases of the injector transistors may comprise resistors or, preferably, forward biased Schottky diodes connected between a voltage source and the bases of the switching transistors.

DETAILED DESCRIPTION

Figure 2:
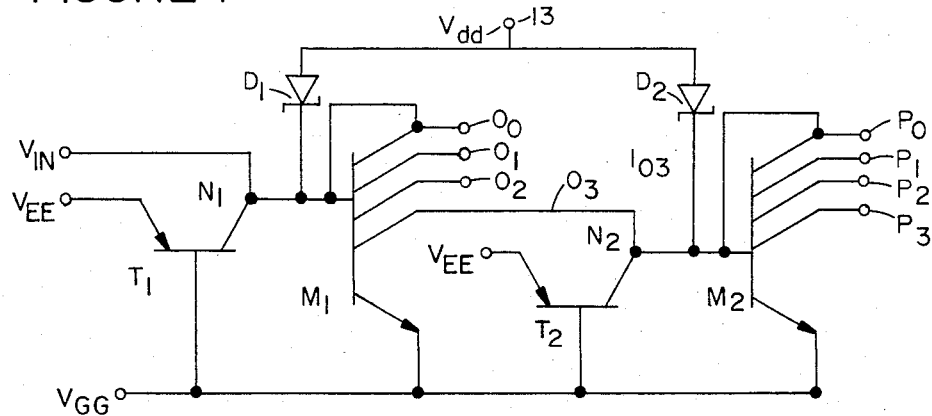
FIG. 2 is a schematic diagram of an integrated injection logic circuit constructed in accordance with this invention.

FIG. 2 shows an integrated injection logic circuit constructed in accordance with this invention. Transistors $T_1$ and $T_2$ are shown as means for providing current to nodes $N_1$ and $N_2$, respectively, although other current sources (such as a resistor or a transistor with controlled base current) may be utilized. Schottky diodes $D_1$ and $D_2$ are connected between terminal 13 and nodes $N_1$ and $N_2$, respectively. The collector $O_0$ of transistor $M_1$ is connected to the base of transistor $M_1$, and the collector $P_0$ of transistor $M_2$ is connected to the base of transistor $M_2$. Collectors $O_0$ and $P_0$ form current mirrors which serve to limit the current flow through collectors $O_1$ through $O_3$ and $P_1$ through $P_3$, as is more fully described below. These current mirrors provided by collectors $O_0$ and $P_0$ can be omitted if the current gain of switching transistors $M_1$ and $M_2$, respectively, are well controlled at a value close to two, and preferably slightly less than two. It is believed that PN diodes may not be used in place of Schottky diodes $D_1$ and $D_2$ due to excessive minority carrier charge storage within the PN diode during forward bias, resulting in the rather slow switching speeds of PN diodes.

As a feature of one embodiment of this invention, a current mirror is formed by connecting one of the plurality of collectors of each switching transistor to its base (FIG. 2). For example, collector $O_0$ of switching transistor $M_1$ is connected to the base of $M_1$. Similarly, the collector $P_0$ of switching transistor $M_2$ is connected to the base of transistor $M_2$. Due to the high current gain or Beta of switching transistor $M_1$ (typically approximately 10-20), substantially all of the injector current supplied by injector transistor $T_1$ flows to the collector $O_0$ of transistor $M_1$ when a logical one (i.e. open circuit) is applied to input terminal 11. The current through collector $O_0$ in turn flows to the emitter of transistor $M_1$ which is grounded. This connection between the base of transistor $M_1$ and collector $O_0$ provides a relatively constant collector current $I_0$ through collector $O_0$. Collector current $I_0$ is determined by the magnitude of $V_{EE}$ (typically 0.8 volts), and the electrical characteristics of transistors $T_1$ and $M_1$. For a circuit fabricated with transistors of 0.5 microns by 0.5 microns per collector, preferably collector current $I_0$ is set at approximately 25 microamps in order to achieve a gate speed, with a fan out of four, of approximately 50 picoseconds. The base current, the base-emitter voltage of transistor $M_1$ and the collector area determine the collector current of each of collectors $O_0$ through $O_3$ of transistor $M_1$. Because the base current and base-emitter voltage are the same with respect to each collector $O_0$ through $O_3$ of transistor $M_1$, the following equation defines the collector currents:

$$I_a/I_0 = A_a/A_0$$

where
$I_a$ = the collector current of collector $O_a$, where a is an integer ranging from 1 to 3;
$I_0$ = the collector current of collector $O_0$;
$A_a$ = the collector area of collector $O_a$; and
$A_0$ = the collector area of collector $O_0$.

Preferably the areas of the collectors $O_1$ through $O_3$ are constructed to be twice the area of collector $O_0$. Alternatively, the base region for the collector $O_0$ may have twice the base impurities per unit area. In this manner, the collector current capable of being sunk by each of collectors $O_1$ through $O_3$ is a little less than $2I_0$. In fact, the collector current $I_0$ of collector $O_0$ is equal to slightly less than the current supplied by the collector of injector transistor $T_2$, because a small portion $1/(1+B)$ of the current supplied by injector transistor $T_2$ forms the base current of transistor $M_2$. Here B is the ratio of collector current to base current of transistor $T_2$. However, this difference is small and for the purposes of this specification, it will be assumed that all the injector current supplied by injector transistor $T_2$ when $V_{IN}$ is high forms collector current through collector $O_0$. Likewise, it will be assumed that when transistor $M_1$ is not conducting, all injector current from transistor $T_2$ forms collector current to collector $P_0$ of transistor $M_2$. Thus, while injector transistor $T_2$ supplies a current $I_0$ to node $N_2$ to turn transistor $M_2$ on, transistor $M_1$ (when on) sinks a current $2I_0$ from node $N_2$, thus causing transistor $M_2$ to turn off. Of this current $2I_0$ sunk by transistor $M_1$, half ($I_0$) is provided by injector transistor $T_2$ and half ($I_0$) is provided by Schottky diode $D_2$. Thus Schottky diode $D_2$ conducts, thus causing the voltage $V_{N2}$ on node $N_2$ to equal $V_{dd}$ (node 13) minus $V_{sk}$, (the voltage drop across a forward biased Schottky diode.

Figure 1:
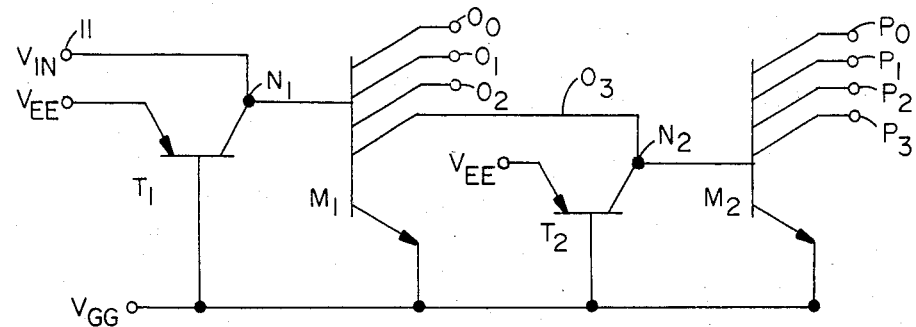
FIG. 1 is a schematic diagram of a prior art integrated injection logic circuit.

Terminal 13 is connected to a positive voltage supply $V_{dd}$, and serves to provide current to Schottky diodes $D_1$ and $D_2$ connected to nodes $N_1$ and $N_2$ respectively. Schottky diodes $D_1$ and $D_2$ limit the low voltage on nodes $N_1$ and $N_2$ by supplying current in addition to the current made available by injector transistors $T_1$ and $T_2$. Thus, when node $N_2$ is low the voltage on node $N_2$ is equal to $V_{low}$, where $V_{low}$ is equal to the voltage $V_{dd}$ applied to terminal 13 minus the forward biased voltage drop $V_{sk}$ of Schottky diode $D_2$. Thus, for example, utilizing Schottky diode $D_2$, the lower voltage limit of node $N_2$ is raised from $V_{s1}$, the collector-emitter saturation voltage of transistor $M_1$ (as previously described in conjunction with the prior art integrated injection logic circuit of FIG. 1, to $V_{low}$ which is about 0.1 volts less than $V_{HIGH}$. In this manner, the voltage swing between a logical one and a logical zero at nodes $N_1$ and $N_2$ is substantially reduced as compared with prior art $I^2L$ circuits. The reduced voltage swing between the two logic levels used in a binary logic circuit results in increased switching speed over prior art integrated injection logic circuits. Additional Schottky diodes are connected between $V_{dd}$ (terminal 13) and all other bases which are used as input terminals of all other switching transistors (e.g. bases to which collectors $O_1$ and $O_2$ of transistor $M_1$ and collectors $P_1$ and $P_2$ of transistor $M_2$ are connected) although these additional switching transistors and Schottky diodes are not shown in FIG. 2. Collector $O_0$ and $P_0$ are not used as output terminals because they are used to form the current mirrors, as previously described. Thus, transistors $M_1$ and $M_2$ of the circuit of FIG. 2 have a fan out of three. Node $N_1$ is connected to $V_{IN}$, which is typically made available on a switching transistor collector (not shown). Thus, Schottky diode $D_1$ serves to prevent saturation of the switching transistor (not shown) regulating $V_{IN}$ connected to node $N_1$.

In the $I^2L$ circuit constructed in accordance with this invention having a fan in of four, the voltage $V_{low}$ is approximately 0.6 volts, and the voltage $V_{high}$ is approximately 0.7 volts. Thus, the voltage swing of nodes $N_1$ and $N_2$ between a logical one and a logical zero is approximately 0.1 volt, as compared with the voltage swing of approximately 0.6 volts of the integrated injection logic circuit of FIG. 1. For circuits constructed in accordance with this invention having fan-ins less than four, it is advantageous to use a voltage swing between logic states of as little as 0.05 volts (for a fan in of one) to further reduce power and increase speed. Conversely, for circuits constructed in accordance with this invention having fan outs greater than four, it is advantageous to use a voltage swing between logical states which is greater than 0.1 volts to provide increased noise immunity and circuit margins. However, this increase in voltage swing need not be great—for a fan out of eight, a voltage swing of 0.12 volts provides adequate margins.

In one embodiment of this invention, Schottky diodes $D_1$ and $D_2$ are connected through terminal 13 to $V_{EE}$ (that is $V_{dd}$ is replaced by $V_{EE}$), the positive voltage supplied to the emitters of injector transistors $T_1$ and $T_2$. The connection of terminal 13 to $V_{EE}$ provides an integrated injection logic circuit in accordance with this invention having increased switching speed over the prior art integrated injection logic circuits. However, connecting Schottky diodes $D_1$ and $D_2$ (terminal 13) to $V_{EE}$ results in a circuit whose characteristics exhibit an undesirable change over operating temperature. For example, as the operating temperature of the device increases, the voltage swing between a logical zero and a logical one decreases. For a sufficiently low voltage swing between logic states, the circuit ceases to function. Furthermore, as the operating temperature of the device decreases, the voltage swing between a logical zero and a logical one increases, thus decreasing the speed of the device.

In order to eliminate the undesirable temperature characteristics which result when terminal 13 is connected to $V_{EE}$, a second embodiment of this invention connects terminal 13 to a second positive voltage source other than $V_{EE}$. For example, many integrated injection logic circuits derive their power from a voltage $V_{cc}$ of approximately 5 volts. For this 5 volt $V_{cc}$ supply suitable circuitry is utilized to generate various bias voltages, such as 5 volts for transistor-transistor logic (TTL) or approximately 0.8 volts for integrated injection logic ($I^2L$). This is typically how $V_{EE}$ is generated on a semiconductor chip, thus allowing the entire chip to be supplied by a single supply voltage $V_{cc}$. In the same manner, a voltage $V_{dd}$ may be generated from $V_{cc}$ and applied to terminal 13 to drive Schottky diodes $D_1$ and $D_2$. The voltage of $V_{dd}$ is typically (at room temperature) approximately 1.0 to 1.2 volts although any voltage capable of providing current to Schottky diodes $D_1$ and $D_2$ sufficient to make the voltage swing on nodes $N_1$ and $N_2$ approximately 0.1 volts between a logical high and a logical low is sufficient. When the semiconductor device contains a plurality of integrated injection logic gates, each gate will have with it an associated Schottky diode connected to $V_{dd}$.

Figure 4:
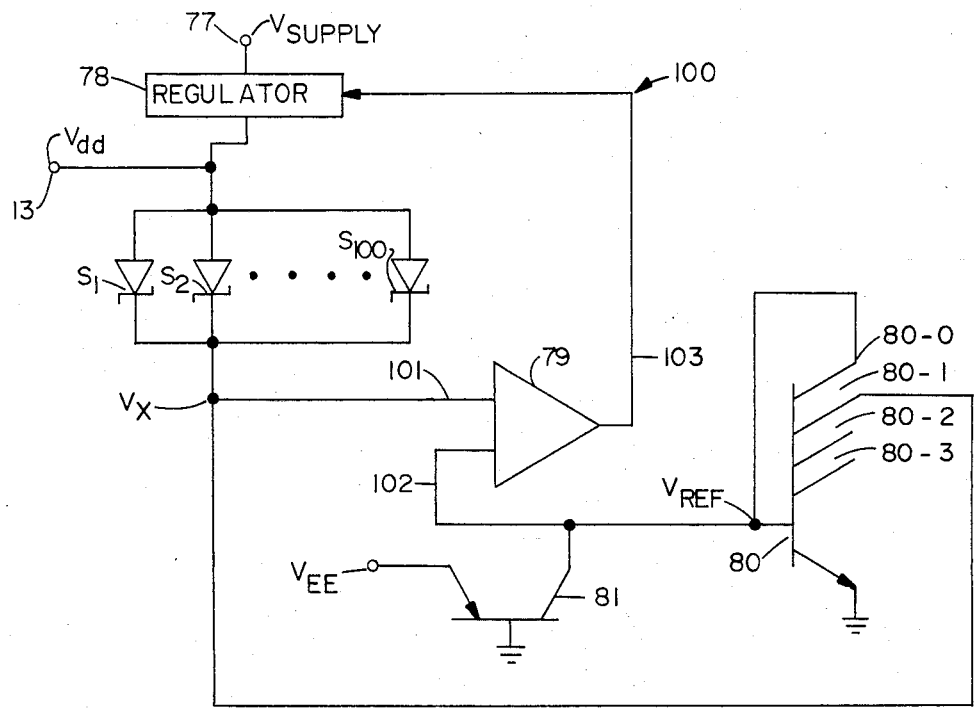
FIG. 4 is a schematic diagram of a circuit for providing a voltage $V_{dd}$ to the Schottky diodes utilized in the circuit of FIG. 2.

FIG. 4 is the schematic diagram of a circuit which is used to provide voltage $V_{dd}$ on terminal 13, which corresponds with terminal 13 of FIG. 2. Biasing circuit 100 comprises PNP injector transistor 81 having its base connected to ground ($V_{GG}$), its emitter connected to a positive voltage source $V_{EE}$, and its collector connected to the base of NPN transistor 80. NPN transistor 80 is identical to the switching transistors $M_1$ and $M_2$ of FIG. 2 in order that the electrical characteristics of transistor 80 closely match the electrical characteristics of transistors $M_1$ and $M_2$. Similarly, PNP injection transistor 81 is identical to PNP injection transistors $T_1$ and $T_2$ of FIG. 2. PNP injection transistor 81 provides base drive to NPN transistor 80, thus forward biasing the base-emitter junction of NPN transistor 80, thereby turning on transistor 80. The emitter of transistor 80 is connected to ground ($V_{GG}$). Thus at 25° C. the voltage $V_{REF}$ on the base of transistor 80 is equal to approximately 0.7 volts, the voltage drop across a forward biased PN junction. The collector 80-0 of transistor 80 is connected to the base of transistor 80. Because transistors 81 and $T_1$ and transistors 80 and $M_1$ are well matched, as previously described, a collector current flows through collector 80-0 which is equal to the collector current $I_0$ flowing through the collector $O_1$ forming the current mirror of transistor $M_1$ (FIG. 2). Because the area of collector 80-1 is twice the area of collector 80-0, collector 80-1 will sink $2I_0$, as previously described for the current mirror formed by collector $O_0$ of transistor $M_1$.

Voltage regulator 78 receives $V_{supply}$ as an input voltage to-be regulated, and provides a regulated output voltage $V_{dd}$ in response to a feedback signal on lead 103 from comparator 79. To achieve a voltage swing of 0.1 volt between on and off states of the switching transistors $M_1$ and $M_2$, output terminal 13 of voltage regulator 78 is connected to the Schottky diodes $D_1$ and $D_2$ of FIG. 2, as well as to the anodes of 100 Schottky diodes $S_1, S_2, \ldots S_{100}$ connected in parallel as shown in FIG. 4. The use of 100 Schottky diodes $S_1$ through $S_{100}$ is a simple and inexpensive technique for providing a voltage $V_{dd}$ which results in a voltage swing on the collectors of the switching transistors (e.g. transistors $M_1$ and $M_2$ of FIG. 2) of approximately 0.1 volt between a logical high (0.7 volts) and a logical low (0.6 volts), as is more fully explained below. If it is desired to have a voltage swing of other than 0.1 volt between a logical high and a logical low, the number of Schottky diodes used in biasing circuit 100 of FIG. 4 can be other than 100. To obtain a voltage swing greater than 0.1 volts between a logical high and a logical low, the number of Schottky diodes must be greater than 100. Conversely, to obtain a voltage swing of less than 0.1 volt between a logical high and a logical low, the number of Schottky diodes must be less than 100. The cathodes of Schottky diodes $S_1, S_2 \ldots S_{100}$ are connected to collector 80-1 of transistor 80. Because collector 80-1 of transistor 89 sinks $2I_0$, as previously described, a current equal to $2I_0$ is drawn from voltage regulator 78 through Schottky diodes $S_1, S_2 \ldots S_{100}$, through collector 80-1 to ground. The input lead 101 of voltage comparator 79 is connected to the cathodes of Schottky diodes $S_1, S_2 \ldots S_{100}$, and the input lead 102 of comparator 79 is connected to the base of transistor 80 (0.7 volts). The output lead 103 from voltage comparator 79 is connected to voltage regulator 78, thereby providing a feedback signal to voltage regulator 78 which in turn controls the voltage $V_{dd}$ on terminal 13. When the voltage $V_X$ on the cathodes of Schottky diodes $S_1, S_2 \ldots S_{100}$ exactly equals the voltage on the base of transistor 80 (0.7 volts), the signal on output lead 103 from comparator 79 is effectively equal to zero, and thus, the voltage $V_{dd}$ remains constant. If the voltage $V_X$ is greater than the voltage $V_{REF}$ on the base of switching transistor 80, a feedback signal is applied from lead 103 of comparator 79 to regulator 78, thus causing regulator 78 to increase the voltage $V_{dd}$. On the other hand, if voltage $V_X$ is less than voltage $V_{REF}$, a signal will be applied from lead 103 of comparator 79 to regulator 78 causing regulator 78 to increase the voltage $V_{dd}$. In this manner, the voltage $V_X$ is regulated to be substantially equal to the voltage $V_{REF}$ (0.7 volts), thus causing $V_{LOW}$ to be about 0.7 minus $0.1 = 0.6$ volts as shown below.

The current/voltage relationship of a PN junction is defined as:

$$I = I_x[\exp(qV/kT) - 1] \quad (1)$$

where
 $I$ = the current through the PN junction;
 $I_x$ = the thermal current of charge carriers through the PN junction in either direction at zero bias;
 $q$ = the charge of an electron ($1.60 \times 10^{-19}$ coulomb);
 $V$ = the voltage across the PN junction;
 $k$ = Boltzmann's constant ($1.38 \times 10^{-23}$ Joules/°K.);
 $T$ = temperature, in °K.

Thus, the voltage $V_{dd}$ is defined in the following equation:

$$2I_0/100 = I_x[\exp(q(V_{dd} - V_x)/kT) - 1] \quad (2)$$

where
 $2I_0/100$ = the current flow through each Schottky diode $S_1, S_2 \ldots S_{100}$; and
 $V_x$ = the voltage on the cathodes of Schottky diodes $S_1, S_2 \ldots S_{100}$, which is regulated to equal 0.7 volts.

Similarly, the voltage/current relationship of a single Schottky diode (e.g. $D_2$ of FIG. 2) connected between $V_{dd}$ and a collector of a switching transistor, when the switching transistor is turned on is defined as:

$$I_0 = I_x[\exp(q(V_{dd} - V_{low})/kT) - 1] \quad (3)$$

where
 $I_0$ = the current through the Schottky diode $D_2$ which is sunk by the collector of the switching transistor; and
 $V_{low}$ = the (logical zero) voltage on node $N_2$ when switching transistor $M_1$ is conducting.

From equations (2) and (3):

$$[\exp(q(V_{dd} - V_{low})/kT) - 1] = 50[\exp(q(V_{dd} - V_x)/kT) - 1] \quad (4)$$

since $\exp(q(V_{dd} - V_{low})/kT)$ is much greater than 1, and since $\exp(q(V_{dd} - V_x)/kT)$ is much greater than 1, equation (4) simplifies to $$q(V_{dd} - V_{low})/kT = \ln 50 + q(V_{dd} - V_x)/kT$$

and since $V_x$ is regulated to be 0.7 volts, $$V_{low} = 0.7 \text{ volts} - (kT/q) \ln 50$$

$$V_{low} \approx 0.6 \text{ volts at } 25° \text{ C.} \quad (6)$$

Thus, the voltage $V_{low}$ on the collectors of injector transistors $T_1$ and $T_2$ (FIG. 2) when transistors $M_1$ and $M_2$ are conducting is equal to 0.6 volts, as compared with the low voltage of 0.1 volt in prior art I²L circuits. The switching transistors $M_1$ and $M_2$ of the I²L circuit constructed in accordance with this invention do not saturate, and the voltage swing at room temperature between a logical one and a logical zero is reduced from 0.6 volts in conventional prior art I²L circuits to 0.1 volt in the present invention. Furthermore, as seen from equation (5), the voltage swing between a logical one and a logical zero is equal to $$V_{high} - V_{low} = (kT/q) \ln 50 \quad (7)$$

within the range of circuit operating temperatures T. In this manner, circuit operating margins are preserved over the operating temperature range. In the embodiment of this invention shown in FIG. 2, close regulation of currents is achieved by basic I²L techniques and by the use of current mirrors. Shunt pull-up diodes $D_1$ and $D_2$ limit the voltage swing between logical states, with the voltage swing being determined, as shown in equation (7), by the ratio of switching transistor collector current when the switching transistor is conducting to switching transistor collector current when the switching transistor is not conducting. The relation between the switching transistor currents when conducting and when not conducting therefore set circuit margins. For example, the ratio of the maximum switching transistor $M_1$ collector current $I_{O3MAX}$ (approximately $2I_0$) to the switching current of switching transistor $M_1$ ($I_0$) is equal to approximately $2I_0/I_0=2$ and is the margin by which switching transistor $M_1$ is held on and the voltage on node $N_2$ is held low. Similarly, the ratio of the switching current $I_0$ switching transistor $M_1$ to the minimum current drawn from node $N_2$ through collector $O_3$ by outputs connected to node $N_2$ is the margin by which switching transistor $M_1$ is held off and the voltage on node $N_2$ held high. For the circuit of FIG. 2, the ratio of switching current $I_0$ to minimum current drawn from collector $O_3$ through node $N_2$ when switching transistor $M_1$ is off is equal to $I_0/[(F_{in})(0.02)(2I_0)]$ where $F_{in}$ is equal to the fan in, and $(0.02)(2I_0)$ represents the current through collector $O_3$ through each input lead connected to node $N_2$ then node $N_1$ is at logical zero and switching transistor $M_1$ is turned substantially off. This current $(0.02)(2I_0)$ when switching transistor $M_1$ is turned off is described more fully below. Thus, this ratio is equal to $1/0.12$ or approximately 8.3 when a fan in of 3 is used. In other words, these margins, expressed in terms of currents, are $(2I_0-I_0)=I_0$ and $(I_0-0.12I_0)=0.88I_0$, respectively, for the high and low states of the voltage on node $N_2$. The temperature behavior of equation (7) exactly corresponds to the temperature behavior not only of thermal (Johnson) noise power, but also to that of the dynamic impedances of the connected junctions, thus tending to preserve noise margins and circuit margins over the operating temperature range.

Further, the logic swing and margin characteristics of the invention are set by geometric layout factors and are, therefore, process independent. For example from equation (7) and the derivation thereof using equations (2), (3) and (4) it is apparent that the logic swing in the present invention is fixed by the ratio of current in the other collectors to the current in the collector coupled to the base and by the ratio of the number of Schottky diodes in the voltage regulator of FIG. 4 to the number of Schottky pull-up diodes in a single gate. That is, the factor natural logarithm of 50 is a factor which depends upon the relative area of the current mirror collector to the other collectors and upon the number of Schottky diodes in parallel in the regulator circuit versus the number of Schottky diodes in each logic gate. These factors can be fixed in the geometrical design and layout of an integrated circuit embodying the invention and will not vary with process variations from one batch of wafers to another.

Equation (7) also reveals that the voltage swing between the logic high and logic low levels varies directly with temperature. This is a very good thing because it means that increasing temperatures will not degrade the noise and circuit immunity of the logic gate of this invention. It is well known that Johnson or thermal noise voltage increases with temperature. It is also well known that the dynamic impedance of a PN junction increases with temperature as can be seen from equation (1). The temperature characteristics of the logic swing defined by Equation (7) compensate for the increase in noise voltage and dynamic impedances of the junctions coupled to the input nodes of the gates of the invention because the logic swing increases with increasing temperature in a linear relationship. This fact guarantees that the noise and circuit immunity of the invention is maintained for rising temperatures.

Conversely for falling temperatures, the logic swing of the invention gets even smaller than the normally small swing of approximately 0.1 volts thereby increasing or maintaining the switching speed of the circuit.

In applicant's invention, the voltage $V_{dd}$ is regulated at a predetermined level such that when, for example, the transistor $M_1$ turns on, the collector to emitter voltage is clamped at approximately 0.6 volts. This results from the fact that $V_{dd}$ is regulated to be, at all times, exactly one forward biased Schottky diode voltage drop above the desired $V_{LOW}$ voltage by the circuit of FIG. 4. Thus when $M_1$ turns on, the Schottky pull-up diode $D_2$ becomes forward biased and the voltage on node $N_2$ is allowed to drop only to $V_{dd}$ minus the forward biased voltage drop across $D_2$. This voltage on $N_2$ with $M_1$ on is, by design, only the desired voltage differential below the $V_{HIGH}$ voltage on $N_2$ when $M_1$ is on. Because the voltage on $N_2$ is only about 0.1 volts more negative than the voltage on $N_1$ coupled to the base of $M_1$, $M_1$'s collector base junction is forward biased but only by about 0.1 volts such that it can conduct a current of 2 $I_0$ but is not sufficiently forward biased to allow $M_1$ to become significantly saturated. Thus no significant (less than 0.1%) minority carrier charge storage occurs in the invention which would slow switching speeds.

The circuit of FIG. 4 and the current mirrors and Schottky pull-up diodes $D_1$ and $D_2$ are the apparatus of the invention for causing the logic swing of the gates to be clamped to a specific range wherein the low end of the range is the minimum acceptable value. The matched transistors and diodes of FIG. 4 emulate the voltages and currents in the gates for all temperatures when the NPN transistors $M_1$ and $M_2$ in the gates are turned on. This insures that the voltage desired for $V_{LOW}$ can be accurately obtained and can be set by geometries and ratios which are process independent. That is, the $V_{LOW}$ voltage can be set at any desired number by varying the number of Schottky diodes in the circuit of FIG. 4 so as to change the term "ln 50" in Equation 7. Thus the logic swing is independent of process variations.

If the logic swing and pull-down currents established by the transistors and diodes of the circuits of FIGS. 2 and 4 were variable with process variations in the characteristics of the transistors and diodes, there would be a problem. Process variations result in devices which are inconsistent from batch to batch in switching speed and which vary significantly within a given batch and even within a single die in a given batch; the obvious result is that logic designers using such circuits must plan for the slowest of the circuits which could result from process variations, thereby slowing the effective switching speed of the circuits.

In the invention, the turn-on time is equal to the turn-off time for one collector pulling down the input node. This follows because the current charging the input node when the switching transistor $M_2$ is to be turned on is equal to the current being pulled out of the input node when the switching transistor $M_2$ is to be turned off. The time to charge the input node to a given voltage therefore equals the time to discharge it. This is an important charateristic of the invention. That is because if the turn-on and turn-off times can vary with process variations, the logic designer must time his logic such that the slowest possible time of the two times is accounted for in the design. If this margin for error is not included in the design, some circuits will not function because process variations cause turn-on or turn-off times to exceed the planned-for timing criteria of the design. The necessity to plan for such possible process variations in the performance of individual gates will force logic designers to design logic circuits which are non-optimal. That is, they are slower than would be the case if the turn-on and turn-off times were known to be equal and non-process dependent.

The current mirror and collector area ratios of the switching transistors in the invention make the turn-on and turn-off times equal and not process dependent. Referring to FIG. 2 the above assertion can be visualized best by example. Assuming that transistor $M_2$ is turned off and $M_1$ is turned on, then a collector current of $2I_0$ is flowing out of node $N_2$ and into collector $O_3$ of $M_1$. Of this $2I_0$ current out of node $N_2$, half or $I_0$ is supplied by the collector of $T_2$ and the other half is supplied through Schottky diode $D_2$. Current out of the base of $M_2$ is negligible. The node $N_2$ will be clamped at a voltage of $V_{LOW}$ in this state.

If $M_1$ is then turned off, the current in collector $O_3$ ceases and $N_2$ begins to charge up from $V_{LOW}$ toward $V_{HIGH}$. The charging current is $I_0$ from $T_2$ plus (initially) another $I_0$ through the Schottky diode $D_2$. After the voltage an $N_2$ rises by a few tens of millivolts, the current component through the Schottky diode $D_2$ falls off and becomes negligible as the diode's forward bias is decreased. However, the capacitance of node $N_2$ is charged by a current of approximately $2I_0$ until such time as the nodal capacitance is charged and the $N_2$ voltage rises sufficiently to turn on $M_2$ and turn off $D_2$.

Now suppose $M_1$ turns back on. Because of the connection of the collector $O_0$ to the $M_1$ base and the ratio of the area of the collector $O_0$ to the areas of the collector $O_3$, the current in the collector $O_3$ is clamped at $2I_0$. Thus the node $N_2$ capacitance and the excess stored minority carrier charge in the base region of $M_2$ are initially being discharged by a current of $2I_0$ flowing out of $N_2$ and the base region of $M_2$ and into collector $O_3$. This is the same value of current that initially started charging the $N_2$ node to turn on $M_2$ except now $N_2$ is being discharged by $2I_0$ to turn $M_2$ off. When the node $N_2$ voltage falls a few tens of millivolts, $M_2$'s excess minority charge has been discharged through collector $O_3$. $D_2$ then turns on to supply a current of $I_0$ to match the $I_0$ collector current out of $T_2$ to make up the $2I_0$ collector current for $M_1$. Of course the regulated voltage $V_{dd}$ and the forward biased diode drop of $D_2$ prevents the $N_2$ voltage from falling below $V_{LOW}$ or 0.6 volts thereby preventing $M_1$ from going heavily into saturation.

Figure 3:
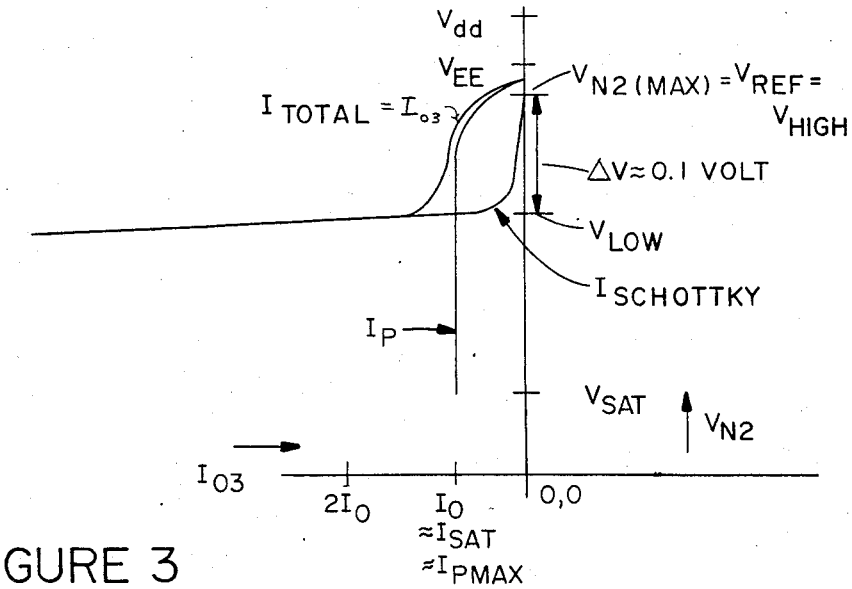
FIG. 3 is a graphical representation of the relationships between the voltage and current characteristics of one output collector of a switching transistor such as $M_1$ or $M_2$ of the integrated injection logic circuit of FIG. 2.

FIG. 3 is a graphical representation of the current $I_{O3}$ through collector $O_3$ of transistor $M_1$ for various voltages appearing on node $N_2$. In addition, the "static" components of the collector current $I_{O3}$ are shown. For example, $I_p$ shows the collector current which flows through collector $O_3$ in the prior art integrated injection logic circuit of FIG. 1. The current $I_p$ is limited essentially to the collector current of injection transistor $T_2$. The line $I_{Schottky}$ shows the contribution to the collector current flowing through collector $O_3$ of the embodiment of this invention shown in FIG. 2 due to the presence of Schottky diode $D_2$. The total current due to these two components is shown in the line labelled $I_{O3}$. It is this current, $I_{O3}$, which flows through collector $O_3$ up to the limit of $2I_0$ (approximately $2I_{pmax}$) as discussed previously.

The currents shown in FIG. 3 are called "static" currents because they do not include currents which flow in order to change the charge stored in the capacitances of the circuit due to changing voltage levels during switching. For the purposes of this specification, it is to be understood that the currents represented in FIG. 3 are these so-called "static" currents. As can be seen by the graphical representation in FIG. 3, at high voltages (i.e. a logical one) on node $N_2$, the total collector current $I_{total}$ is formed primarily by the contribution due to the presence of prior art integrated injection logic circuit components. However, with a logical one on node $N_2$, the current $I_{total}$ is somewhat greater as compared with prior art $I^2L$ circuits because the switching transistor $M_1$ (FIG. 2) is not turned completely off when node $N_1$ is at a logical zero. A logical zero on node $N_1$ corresponds to approximately 0.6 volts, as compared with a logical zero of approximately 0.1 volt in prior art $I^2L$ circuits. However, with a logical zero (0.6 volts) on the base of switching transistor $M_1$, the collector current $I_p$ is equal to only approximately two percent (2%) of the maximum collector current $I_{sat}$ (i.e. with a logical one equal to 0.7 volts connected to the base of switching transistor $M_1$) per output lead connected to node $N_2$. For example, if two output leads are connected to node $N_2$ (from two separate logic gate outputs in a "wired NAND" configuration, previously described), sufficient base current to node $N_2$ is provided by the logical zero (0.6 volts) state of the two driving gates to cause a pull-down current at node $N_2$ which is equal to approximately four percent (4%) of the maximum collector current $I_{sat}$ which flows when transistor $M_1$ is saturated. However, this small current which flows when the driving gates are "off" does not, on balance, adversely affect circuit operation for the range of operation described here, but does so below about 0.07 volts for fan-in=fan-out=4.

When the voltage on node $N_1$ is increased from the low state to the high state, collector current $I_{O3}$ of transistor $M_1$ increases, thus causing voltage $V_{n2}$ on node $N_2$ to decrease. As the voltage $V_{n2}$ on node $N_2$ decreases, additional shunt current is supplied by Schottky diode $D_2$, thus increasing the total collector current $I_{total}$ as compared with the saturated current $I_{sat}$ of collector $O_3$ of transistor $M_1$ which would flow in the circuit of FIG. 1. In this manner, Schottky diode $D_2$ supplies current which is otherwise unavailable in a prior art integrated injection logic circuit, thus preventing the voltage $V_{n2}$ on node $N_2$ from decreasing to $V_{s1}$, the collector-emitter voltage of transistor $M_1$ when transistor $M_1$ is saturated. This increases the voltage on node $N_2$ when node $N_2$ is low level (logical zero) as compared with prior art $I^2L$ circuits. Due to the decrease in the voltage swing between logical one and logical zero, the change of charge stored in the capacitance associated with node $N_2$ due to switching between a logical zero and a logical one is also decreased thereby providing increased switching speeds of the integrated injection logic circuit of this invention as compared with the switching speeds of prior art integrated injection logic circuits.

As shown in FIG. 3, the use of Schottky diodes in accordance with this invention limits the low level voltage excursion of voltage $V_{n2}$ on node $N_2$. In prior art integrated injection logic circuits, when transistor $M_1$ of FIG. 1 turns on, current equal to $I_{sat}$ flows from node $N_2$ through the collector $O_3$, thus resulting in a voltage $V_{s1}$ equal to approximately 0.1 volt on node $N_2$, where $V_{s1}$ is the saturation voltage of the collector-emitter voltage of $M_1$. Of importance, when Schottky diodes are utilized in accordance with this invention as in FIG. 2, the low level (logical zero) voltage on node $N_2$ is limited (as shown in FIG. 3) to $$V_{low} = V_{dd} - V_{sk},$$

where $V_{low}$ is the voltage associated with a logical zero;

$V_{dd}$ is the voltage applied to Schottky diodes via terminal 13; and $V_{sk}$ is the forward bias voltage drop across Schottky diode $D_2$ with a current $I_0$ flowing through Schottky diode $D_2$, as previously described.

Thus, as previously described, the low level (logical zero) voltage $V_{low}$ on node $N_2$ is equal to approximately 0.6 volts. The high level (logical one) voltage $V_{high}$ on node $N_2$ is equal to $V_{EE} - V_{S2}$, because, in a similar manner as previously discussed with regard to the prior art circuit of FIG. 1, node $N_2$ is not pulled down by the non-conducting transistor $M_1$. Thus, with $V_{EE} = 0.8$ volts and $V_{S2} = 0.1$ volts, a logical one on node $N_2$ is equal to approximately 0.7 volts.

The voltage swing on node $N_2$ between a logical high and a logical low is equal to $V_{high}$ minus $V_{low} = \Delta V$ which is approximately equal to 0.1 volts. In comparison, prior art integrated injection logic circuits provide a voltage swing on node $N_2$ equal to $V_{high}$ minus $V_{S1}$ thus providing a voltage swing approximately equal to 0.6 volts.

Figure 6:
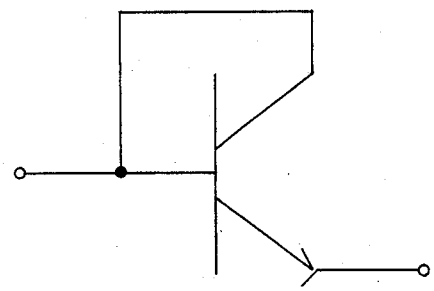
FIG. 6 is a schematic diagram of a bipolar transistor connected so as to serve as a diode pullup means suitable for use with this invention.

Although the circuit of the present invention has been described as including exemplary voltage pull up means in the form of Schottky diodes, other well-known and available low charge storage diode devices may be used. For example, as shown is FIG. 6, one such device includes a transistor having a base, an emitter, and at least one collector with the collector coupled to the base. So-called "diode connected transistors," as shown in FIG. 6, can be used in place of Schottky diodes $D_1$ and $D_2$. The maximum current density of a Schottky device is not yet known, but it is known that a diode connected transistor will provide at least the same current density as switching transistors $M_1$ and $M_2$. A diode connected transistor will provide greater current density than a diode, and will have by comparison an insignificant stored charge, therby providing small size and high speed.

The integrated injection logic circuit of this invention utilizing bipolar transistors consumes more power than prior art integrated injection logic circuits while providing faster switching speeds. The current consumption of an integrated injection logic circuit constructed in accordance with this invention is approximately twice as great as the current consumption of a prior art integrated injection logic gate utilizing approximately the same injector current supplied by the PNP injector transistor having its emitter connected to $V_{EE}$. The additional current consumption is due to the presence of one Schottky diode per gate. Utilizing small geometry, such as 0.5 micron line widths, integrated injection logic circuits may be constructed in accordance with this invention having switching speeds of approximately 50 to 100 picoseconds, while utilizing a fan-out of four, with an injector current of approximately 25 to 50 microamps per gate.

Figure 5:
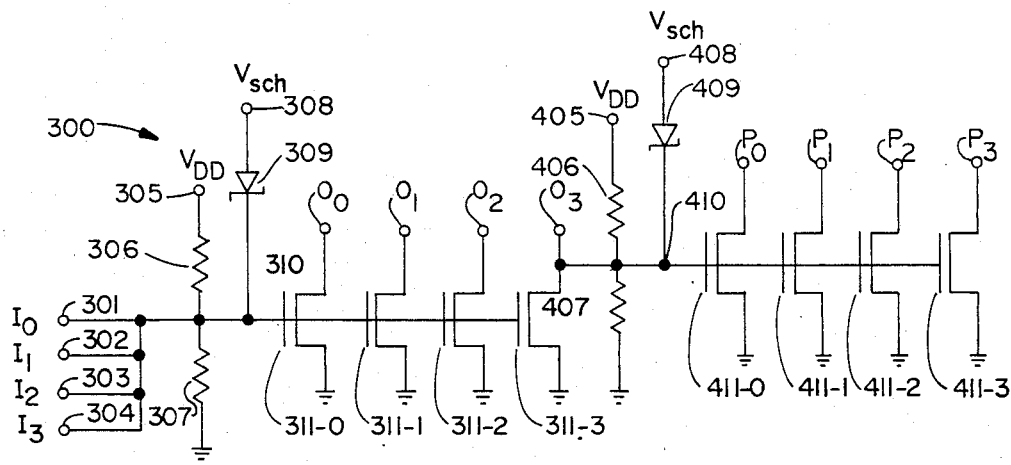
FIG. 5 is a schematic diagram of a circuit constructed in accordance with this invention which utilizes metal-oxide-silicon transistors.

A circuit constructed in accordance with this invention, utilizing metal-oxide-silicon (MOS) transistors, is shown in FIG. 5. Input terminals 301, 302, 303, and 304 receive input signals $I_0$, $I_1$, $I_2$ and $I_3$, respectively. Terminals $O_0$ through $O_3$ and $P_0$ through $P_3$ serve as open source output terminals which may be connected (as is terminal $O_3$) to other circuitry, as desired. A resistive voltage divider comprising resistors 306 and 307 is connected between terminal 305 connected to a voltage $V_{dd}$, and ground such that a fraction of the voltage $V_{dd}$ (denoted as $V_{high}$) is applied to input node 310. The voltage $V_{high}$ established by the voltage divider comprising resistors 306 and 307 provides the high level logic signal (arbitrarily defined as a logical "one") on input node 310. With logical ones applied to input terminals 301 through 304, the signal on node 310 is a logical one. On the other hand, if any signal $I_0$ through $I_3$ applied to input terminals 301 through 304 is a logical zero (low voltage), input node 310 is pulled down to that low voltage. In a manner similar to the circuit of FIG. 2, Schottky diode 309 connected between terminal 308 and input node 310 limits the voltage on node 310 corresponding to a logical zero. Input terminal 308 is connected to a voltage supply $V_{sch}$ which is utilized to power the Schottky diodes of the circuit in a manner similar to the $V_{dd}$ supply of FIG. 4 for supplying the embodiment of FIG. 2.

Input node 301 is connected to the gates of MOS switching transistors 311-0 through 311-3, thus providing open source outputs $O_0$ through $O_3$, respectively. Each output terminal $O_0$ through $O_3$ may be connected to input nodes of additional logic gates, as desired. Furthermore, the number of switching tansistors associated with each logic gate need not be four as shown in FIG. 5, but may be any desired number consistent with good MOS semiconductor design practice.

Preferably the voltage $V_{low}$ corresponding to a logical zero is set to approximately 0.9 volts (corresponding to a less than that of prior art MOS logic circuits designed for low voltage swings in which the logical one state is typically 1.5 volts and the logical zero state is typically 0 volts. As stated previously with respect to the logic circuit of FIG. 2 which is constructed in accordance with the invention utilizing bipolar transistors, the reduced signal swing between the logical one and the logical zero will result in increased speed due to the reduced amount of time required to change the charge stored in the node capacitances of this circuit. Furthermore, the speed-power product of the circuit constructed in accordance with this invention utilizing MOS devices is less than the speed-power product of a comparable MOS logic circuit of the prior art.

An improved version of the circuit of FIG. 5 substitutes for resistor 307 an additional Schottky diode having its anode connected to input node 310 and its cathode connected to a second Schottky reference voltage, $V_{sch2}$. Similarly, resistor 407 is replaced by a Schottky diode having its anode connected to node 410 and its cathode connected to the reference voltage $V_{sch2}$. In this manner, the additional Schottky diodes establish the voltage $V_{high}$ corresponding to a logical one equal to $V_{sch2}$ plus one forward biased Schottky diode voltage drop. For a typical value of $V_{sch2} = 0.7$ volts, and a forward biased Schottky diode voltage is equal to 0.5 volts, $V_{high}$ is equal to 1.2 volts.

The bias voltages $V_{sch}$ (connected to Schottky diodes 309 and 409) and $V_{sch2}$ (connected to the Schottky diodes replacing resistors 307 and 407 of FIG. 5) can be set and controlled over a wide temperature range by the technique embodied in FIG. 4, previously described in conjunction with the circuit constructed in accordance with this invention utilizing bipolar transistors.

Figure 7:
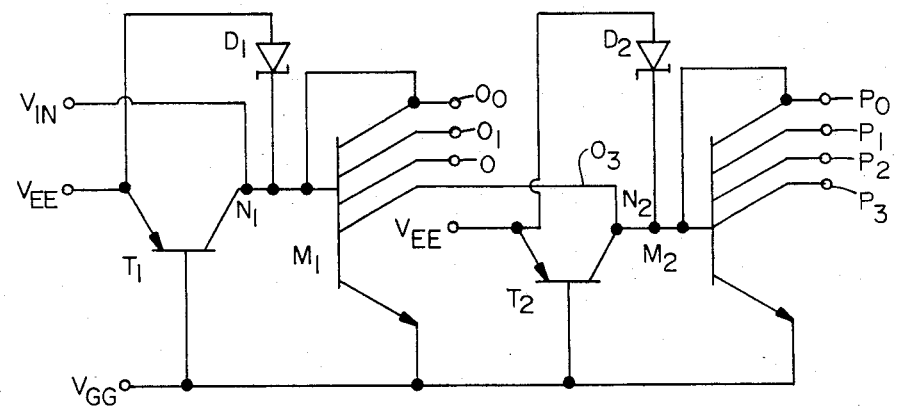
FIG. 7 is a circuit diagram for another embodiment of the invention.

Turning now to FIG. 7 there is shown another embodiment of the invention of FIG. 2. In the FIG. 7 embodiment however, the pull-up diodes $D_1$ and $D_2$ have their anodes coupled to the $V_{EE}$ voltage supply instead of to the regulated voltage supply $V_{dd}$. In all other respects, the operation of the circuit of FIG. 7 is indentical to the operation of the circuit of FIG. 2. The embodiment of FIG. 7 is not quite as effective as the embodiment of FIG. 2 however for the reasons discussed above. Basically the reason is that in the FIG. 7 embodiment, the logic swing decreases with increasing temperature. In contrast, the logic swing of the FIG. 2 embodiment increases with increasing temperature—a desirable characteristic because of the presence of increased noise power and increased PN junction dynamic impedance at higher temperatures.

There is yet another beneficial effect of using a separate regulated voltage source to supply the Schottky pull-up diode which is independent of the voltage supply for the injector. By separating the injector voltage supply from the pull-up supply for the input node, it is possible to clamp the logic swing on any output node to about 0.1 volts. This makes it possible to use a non-saturating device such as a resistor as the injector without the adverse effects that such a resistor would cause in prior art I²L circuits. In the prior art, with a large voltage swing on the base of the switching transistor, large changes in the amount of injector current available through the injector resistor would occur. The amount of this variation would of course depend upon the value of the resistor, i.e., the slope of its load line. To minimize the variation meant increasing the power supply voltage and resistance increase the power dissipation. A smaller resistor would, on the other hand, cause a larger variation which would change the turn-on and turn-off times.

Figure 8:
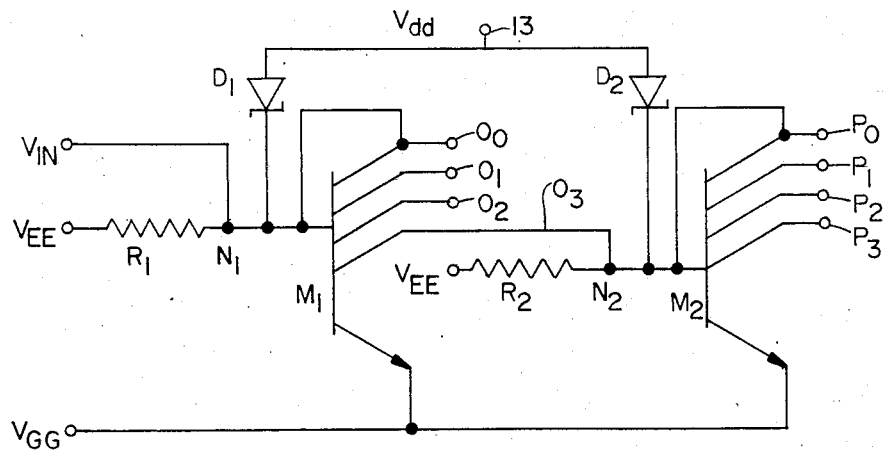
FIG. 8 is a circuit diagram for the preferred embodiment of the invention.

The embodiment of FIG. 8 restricts this problem to negligible scope by limiting the logic swing to a very small value. In this manner, a resistor and power supply voltage can be chosen which supply adequate injector current for good switching speed while minimizing the power dissipation. The advantage of using a resistor instead of an injector transistor is that a resistor has lower capacitance and is non-saturating and, therefore, will not slow circuit operation down because of excess charge storage. PNP injector transistors are usually used in the prior art because they act as current sources. That is, they supply a steady amount of injector current regardless of the collector to base voltage drop caused by the logic swing on the input node of the NPN switching transistor. However, their characteristic of excess minority carrier charge storage is the penalty which must be paid to have the current source attributes.

The preferred embodiment of the invention is shown in FIG. 8. In this embodiment, all elements and connections are the same except that a resistor has been substituted as the current injection device in place of the PNP transistor in each gate. The advantage of this arrangement is that a resistor is a non-saturating device. Therefore there is no excess minority carrier charge storage to be charged or discharged when attempting to charge the voltage on the nodes $N_1$ and $N_2$ during switching operation.

With PNP injection transistors as shown in the circuit of FIG. 2, there is excess minority carrier charge storage in the base region. This charge storage results because the PNP transistor is always in saturation since its base is always more negative than both its collector and its emitter. Therefore both the emitter-base and base collector junctions are forward biased, and the transistor is saturated. Because the base-collector junction is forward biased, any charge stored in the base regions of the PNP devices becomes charge stored in the nodes $N_1$ and $N_2$. Therefore, lowering of the voltage on the nodes $N_1$ and $N_2$ requires removal of the excess minority carrier charges stored in the base region.

Likewise, in order to raise the voltage on the nodes $N_1$ and $N_2$, the charge storage capacity of the base region and the collector-base junction of the PNP transistor must be filled.

The elimination of the above problem requires that the charge storage effects of the PNP transistor be eliminated. One way to do that is to substitute a resistor in place of the PNP transistor. However in prior art integrated injection logic devices with large logic swings on the nodes $N_1$ and $N_2$, substitution of a resistor for the PNP device led to undesirable effects. The advantage of a PNP injection transistor is that the injection current is substantially constant and independent of the voltage between the nodes $N_1$, $N_2$ and ground. This results from the current source attributes of the PNP injection transistor.

A resistor however does not have these same current source attributes however. As a result, the amount injection current flowing through the resistor depends upon the voltage on the nodes $N_2$ and $N_1$. When these voltages vary widely with a large logic swing, so does the amount of injection current. It is desirable to have a constant amount of injection current for reasons known to those skilled in the art.

Figure 9:
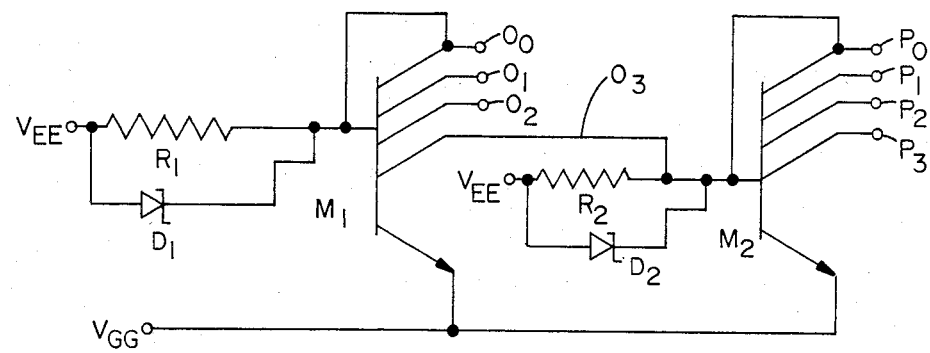
FIG. 9 is a circuit diagram for another form of the preferred embodiment.

Resistors $R_1$ and $R_2$ can be used, however, in the embodiments of FIGS. 8 and 9 because the current mirrors and regulated $V_{dd}$ supply per the circuit of FIG. 4, clamp the logic swings on the nodes $N_1$ and $N_2$ to the minimum acceptable value. This results in minimization of variations of injection current into the nodes $N_1$ and $N_2$ thereby eliminating the problems of the prior art. The embodiment of FIG. 8 is faster than the embodiment of FIG. 2 because of elimination of the excess minority carrier charge storage problem caused by the use of a PNP injector.

Further the invention of the FIG. 8 embodiment is the fastest possible I²L circuit available. The switching speed of a saturating bipolar logic gate is related to the amount of charge which must be removed from or supplied to the input node to cause the switching transistor to change states. The charge that must be removed from or added to the input node has two components—the excess minority carrier charge stored in the base region of the switching transistor plus the charge stored in all the other capacitances associated with the input node. In the invention, as apparent from the explanation herein of how it works, the stored minority carrier charge in the base region of each switching transistor is minimized and the logic swing at each input node is clamped at the minimum acceptable swing. The minimization of stored minority carriers in the base region results from clamping of the logic swing at each input node to a minimum $V_{LOW}$ of approximately 0.1 volts below $V_{HIGH}$ and from the clamping of gain by the current mirror This has the effect of clamping the collector to base junction at a forward bias of no more than approximately 0.1 volts when the switching transistor is on. Therefore the switching transistor is not allowed to go heavily into saturation if at all, and, therefore, minority carrier storage is minimized. Further, from this clamping of the logic swing at the input node to the minimum acceptable level, it follows that the amount of charging and discharging of the other capacitances associated with the input node to charge the voltage thereof is also minimized. Therefore the time it takes to do this charging from $V_{LOW}$ to $V_{HIGH}$ is also minimixed.

Turning now to the embodiment of FIG. 9, it is seen that as in the embodiment of FIG. 8, a resistor is used as the injection means with all the attendant advantages. However, in the embodiment of FIG. 9, the pull-up diodes $D_1$ and $D_2$ have their anodes coupled to the $V_{EE}$ injection voltage supply instead of to $V_{dd}$. This results in slightly less desirable characteristics for the clamping of the logic swing, but still cuts the voltage differential of the logic swing down considerably. The operation of the embodiments of FIGS. 7, 8 and 9 are in all other respects similar to the operation of the embodiment of FIG. 2. Of Course, the diode connected transistor of FIG. 6 could be substituted for the Schottky diodes of the embodiments of FIGS. 7, 8 and 9 as well as the FIG. 2 embodiment.

While several embodiments of this invention have been disclosed in this specification, these embodiments are not limitations of the scope of this invention. Other embodiments will become apparent to those skilled in the art in light of this specification.

I claim:

1. An integrated injection logic circuit comprising: means for providing an injection current; a switching transistor having a base coupled to said means for providing an injection current and serving as an input node, and having at least one collector serving as an output node, and a collector connected to said base; and additional means coupled to said base for clamping the logic swing at said base to a predetermined range determined by geometric ratios of components in the layout of the integrated circuit which ratios are independent of process variations.

2. Structure as in claim 1 wherein said means for providing an injection current is a resistor coupled to a voltage source.

3. An integrated injection logic circuit as in claim 1 wherein said clamping means causes the logic swing to be clamped to approximately 0.1 volts.

4. An integrated injection logic circuit as in claim 1 wherein said injection means is a resistor and said clamping means includes a voltage regulator and a schottky diode having its cathode coupled to said base, where said voltage regulator regulates the voltage on the anode of said diode to be one forward biased schottky diode voltage drop above the desired logic low voltage.

5. An integrated injection logic circuit as in claim 1 wherein said additional means serves to provide a voltage variation between a logical 0 and a logical 1 signal on said base equal to a voltage within the range of approximately 0.075 to 0.125 volts.

6. An integrated injection logic circuit comprising: means for providing an injection current; a switching transistor having a base coupled to said means for providing an injection current and serving as an input node, and having at least one collector serving as an output node, and a collector connected to said base; pull up means coupled to said base for clamping the logic swing at said base to a predetermined range determined by geometric ratios which are independent of process variations; and wherein said pull up means includes a diode which minimizes charge storage having its anode connected to a first potential which is independent of a second potential supplying said injection means, said first potential being regulated to guarantee said predetermined logic swing and its cathode coupled to said base of said switching transistor.

7. Structure as in claim 6 wherein said means for providing an injection current is a resistor coupled to a voltage source.

8. An integrated injection logic circuit comprising: means for providing an injection current; a switching transistor having a base coupled to said means for providing an injection current and serving as an input node, and having at least one collector serving as an output node, and a collector connected to said base; and additional means coupled to said base for causing the logic swing to increase with increasing temperature to substantially prevent degradation of the noise immunity and circuit margins of said logic circuit with increasing thermal noise power.

9. Structure as in claim 8 wherein said means for providing an injection current is a resistor coupled to a voltage source.

10. An integrated injection logic circuit comprising: means for providing an injection current; a switching transistor having a base coupled to said means for providing an injection current and serving as an input node, and having at least one collector serving as an output node, and a collector connected to said base; and additional means for controlling the current flowing into and out of said base of said switching transistor in such a way as to cause turn-on time to substantially equal turn-off time for a similar logic circuit connected to said output node.

11. Structure as in claim 10 wherein said means for controlling the current flowing into and out of said input node includes means for causing the collector current in the collector coupled to said base to be one half the collector current of the other collectors of said switching transistor for the same base to emitter voltage.

12. Structure as in claim 10 wherein said means for providing an injection current is a resistor coupled to a voltage source.

13. An integrated logic circuit comprising: means for providing an injection current; a switching transistor having a base coupled to said means for providing an injection current and serving as an input node, and having at least one collector serving as an output node, and a collector connected to said base; and pull up means coupled to said base for clamping the logic swing at said base to a predetermined range determined by geometric ratios of components in the layout of the integrated circuit which are independent of process variations; and wherein said injection means comprises a bipolar transistor having a base coupled to the same potential as said emitter of said switching transistor, an emitter coupled to an injection potential and a collector coupled to said input node and said pull up means includes a Schottky diode having its anode coupled to a regulated pull up potential and its cathode coupled to said input node where said pull up potential is regulated by said pull up means to cause a predetermined logic swing.

14. An integrated injection logic circuit comprising:
means for providing an injection current;
a switching transistor having a base coupled to said means for providing an injection current and serving as an input node, and having at least one collector serving as an output node, and a collector connected to said base;
pull up means coupled to said base for clamping the logic swing at said base to a predetermined range determined by geometric ratios which are independent of process variations and wherein said pull up means includes a diode which minimizes charge storage having its anode connected to a first potential which is independent of a second potential supplying said injection means, said first potential being regulated to guarantee said predetermined logic swing and its cathode coupled to said base of said switching transistor and;
wherein said injection means comprises a non-saturating current source.

15. An integrated injection logic circuit comprising:
means for providing an injection current;
a switching transistor having a base coupled to said means for providing an injection current and serving as an input node, and having at least one collector serving as an output node, and a collector connected to said base;
pull up means coupled to said base for clamping the logic swing at said base to a predetermined range determined by geometric ratios which are independent of process variations;
wherein said pull up means includes a transistor having its base connected to its collector to act as a low minority carrier storage diode to pull up said input node.

16. An integrated injection logic circuit comprising:
an input node for receiving an input logic signal;
an injection means coupled to a first potential for supplying injection current to said input node;
a switching transistor having its base coupled to said input node and having a first collector coupled to said base and having a second collector serving as an output node which has twice the area of said first collector; and
a low charge storage diode means coupled between said first potential and said input node for assisting in pulling up the voltage on said input node when said switching transistor is to be turned on.

17. An integrated injection logic circuit as defined in claim 16 wherein said low charge storage diode means is a Schottky diode.

18. An integrated logic circuit comprising:
an input node for receiving an input logic signal;
an injection means coupled to a first potential for supplying injection current to said input node;
a switching transistor having its base coupled to said input node and having a first collector coupled to said base and having a second collector serving as an output node which has twice the area of said first collector; and
a low minority carrier charge storage diode means coupled between said first potential and said input node for assisting in pulling up the voltage on said input node when said switching transistor is to be turned on wherein said low minority carrier storage diode means is a transistor with its collector coupled to its base.

19. A method of operating an integrated injection logic circuit comprising the steps of:
injecting a predetermined current into an input node of an integrated injection logic gate from a first potential source; and
clamping the logic swing on the input node of said integrated injection logic circuit to a predetermined acceptable value which is determined by geometric ratios of physical characteristics of components of the integrated circuit layout, said logic swing being independent of process variations.

20. The method of claim 19 wherein said integrated injection logic gate has an input node coupled to the base of a switching transistor, an injection circuit for injecting pull up current into said input node, and an output node connected to a collector of the switching transistor, and wherein said output node is coupled to the input node of a next integrated injection logic gate of the same structure and further comprising the step of controlling the current gain of said switching transistor in said integrated injection logic circuit such that the current which is sunk by the collector of said switching transistor when it is pulling down the input node of said next integrated injection logic gate is equal to about twice the injection current to the input node of said next gate supplied by the injection circuit of the succeeding gate.

21. The method of claim 20 wherein the clamping step includes the steps of:
supplying a predetermined value of pull up current to said input node through a low charge storage diode means connecting a regulated potential source to said input node;
controlling the current gain of said switching transistor such that the pull down current from any input node of said next logic circuit is substantially equal to the pull up current injected into said input node of said next logic circuit by said injection circuit and through said low charge storage diode.

22. The method of claim 19 wherein the step of clamping the logic swing includes the steps of:
supplying additional pull up current to said input node through a low charge storage diode means from a regulated potential source; and
regulating said potential source in such a manner that said logic swing is clamped to a predetermined value.

23. The method of claim 22 wherein the regulating step includes the step of regulating the potential source such that the logic swing increases with increasing temperature.

24. A method of operating an integrated injection logic circuit comprising the steps of:
injecting a predetermined current into an input node of an integrated injection logic gate from a first potential source;
clamping the logic swing on the input node of said integrated injection logic circuit to a predetermined minimum acceptable value which is determined by ratios of physical factors which ratios are independent of process variations wherein the step of clamping the logic swing includes the steps of:

supplying additional pull up current to said input node through a low charge storage pull up diode from a regulated potential source which includes low charge storage diodes;

regulating said potential source in such a manner that said logic swing is proportional to the ratio of the number of matching low charge storage diodes in the regulated potential source to the number of low charge storage pull up diodes connected to said input node of the logic gate.

25. An integrated injection logic circuit comprising:
first means for providing an injection current;
a switching transistor having a base coupled to said means for providing injection current and serving as an input node, and having at least one collector serving as an output node, and a collector connected to said base; and
second means for limiting the maximum current flow through said collector serving as an output node to approximately twice the current flowing through said collector connected to said base; and
third means coupled to said base for acting with said second means to clamp the logic swing at said base to a predetermined range determined by geometric ratios of components in the layout of the integrated circuit which ratios are independent of process variations.

26. The apparatus of claim 25 wherein said second means for limiting comprises a portion of the base region of said transistor associated with one of said collectors as the base region therefor and selectively doped to have twice the base impurities of surrounding regions of the base region associated with the other collectors as the base regions for the transistors of each said other collector.

27. The apparatus of claim 26 wherein the base-collector junction formed by said portion of said base region which is selectively doped and its associated collector region has the same approximate area of the base-collector junction formed by the intersection of the collector reading of each of the other collectors with other portions of said base.

28. The apparatus of claim 27 wherein said third means includes a diode which minimizes charge storage having its anode for coupling to a first potential which is independent of a second potential supplying said first means, said first potential being regulated to guarantee said predetermined logic swing and its cathode coupled to said base of said switching transistor.

29. The apparatus of claim 25 wherein said second and said third means combine to cause the logic swing to increase with increasing temperature to substantially prevent degradation of the noise immunity and circuit margins of said logic circuit with increasing thermal noise power.

30. The apparatus of claim 25 wherein said second means and said third means combine to cause the current flowing into and out of said base of said switching transistor in such a way as to cause turn-on time to substantially equal turn-off time for a similar logic circuit connected to said output node.

31. The apparatus of claim 25 wherein said first means is a resistor coupled to a voltage source.

32. A method of operating an integrated injection logic circuit having a switching transistor with multiple collectors, and one base serving as an input node, one of said collectors being connected to said base and another collector serving as an output node and having an injector for injecting current into said input node and having pull up means coupled to said input node to limit the logic swing thereon comprising the steps of:

limiting the maximum current flow in said collector serving as said output node to approximately twice the current flow in the collector coupled to said base; and regulating the voltage of said pull up means so as to limit the logic swing at said input node to a predetermined value.

33. The method of claim 32 wherein the step of regulating the voltage of said pull means comprises the step of regulating the voltage at a pull up node which is coupled to said input node by a low minority carrier charge storage diode to a voltage which is a predetermined value below the high voltage of the logic swing at said input node.

34. The method of claim 33 wherein said regulating step regulates the voltage at said pull up node to be one forward biased diode junction drop below the high voltage level of said logic swing.

35. The method of claim 34 wherein said regulating step regulates the voltage at said pull up node to be one forward biased diode junction drop of a low minority carrier charge storage diode below the high voltage level of said logic swing.

* * * * *

UNITED STATES PATENT AND TRADEMARK OFFICE
CERTIFICATE OF CORRECTION

PATENT NO. : 4,629,912

DATED : Dec. 16, 1986

INVENTOR(S) : Early

It is certified that error appears in the above-identified patent and that said Letters Patent is hereby corrected as shown below:

Please correct the listing of "Attorney, Agent, or Firm" to read as follows:

--Attorney, Agent, or Firm--Carl L. Silverman, David H. Carroll, and Ronald C. Fish--

Signed and Sealed this

Thirty-first Day of March, 1987

Attest:

DONALD J. QUIGG

Attesting Officer

Commissioner of Patents and Trademarks